United States Patent
Elsasser et al.

(10) Patent No.: US 11,064,623 B2
(45) Date of Patent: Jul. 13, 2021

(54) SLIDABLE ASSEMBLY WITH SPRING CLIP RETAINER

(71) Applicant: INTERNATIONAL BUSINESS MACHINES CORPORATION, Armonk, NY (US)

(72) Inventors: Ryan Elsasser, Poughkeepsie, NY (US); Camillo Sassano, Durham, NC (US); William Risk, San Jose, CA (US); Matthew Butterbaugh, Rochester, MN (US); Michael Good, Fountain, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/448,155

(22) Filed: Jun. 21, 2019

(65) Prior Publication Data
US 2020/0404800 A1    Dec. 24, 2020

(51) Int. Cl.
*H05K 7/14*    (2006.01)

(52) U.S. Cl.
CPC ......... *H05K 7/1411* (2013.01); *H05K 7/1489* (2013.01)

(58) Field of Classification Search
CPC ........................... H05K 7/1411; H05K 7/1489
See application file for complete search history.

(56) References Cited

U.S. PATENT DOCUMENTS

| 3,984,191 A | 10/1976 | Doty |
| 6,046,905 A | 4/2000 | Nelson et al. |
| 6,080,930 A | 6/2000 | Lommen et al. |
| 6,101,686 A | 8/2000 | Velthoven et al. |

(Continued)

FOREIGN PATENT DOCUMENTS

| CN | 103600217 A | 2/2014 |
| CN | 203756691 U | 8/2014 |
| WO | WO 2016/099455 A1 | 6/2016 |

OTHER PUBLICATIONS

Sun Microsystems, Inc., "Sun X4500-J Slide Rail Installation Guide", Sun Microsystems, Inc., Online Product Brochure, https://docs.oracle.com/cd/E19122-01/j4500.array/820-7238-10/820-7238-10.pdf (2009) (26 pages).

(Continued)

*Primary Examiner* — Rockshana D Chowdhury
(74) *Attorney, Agent, or Firm* — Tihon Poltavets, Esq.; Kevin P. Radigan, Esq.; Heslin Rothenberg Farley & Mesiti P.C.

(57) ABSTRACT

Slidable assemblies are provided which include a support, a slidable assembly, and a spring-clip element. The slidable assembly, which includes a slide member, is coupled to the support to slide along the support between a first position and a second position. The spring-clip element is associated with the support, and receives the slide member of the slidable assembly. The slide member translates within the spring-clip element as the slidable assembly is slid between the first position and the second position, and is retained by the spring-clip element in position when the slidable assem- (Continued)

bly is slid to the second position to hold the slidable assembly and restrain the slidable assembly from sliding along the support to the first position.

20 Claims, 10 Drawing Sheets

(56) References Cited

U.S. PATENT DOCUMENTS

| | | | |
|---|---|---|---|
| 6,285,548 B1 | 9/2001 | Hamlet et al. | |
| 6,381,136 B1 | 4/2002 | Nelson et al. | |
| 6,566,973 B2 | 5/2003 | Schumacher | |
| 6,588,866 B2 | 7/2003 | Cheng | |
| 7,031,150 B2 * | 4/2006 | Chen | G06F 1/184 |
| | | | 248/611 |
| 7,262,972 B1 | 8/2007 | Gundogan et al. | |
| 7,656,681 B2 | 2/2010 | Tracewell | |
| 7,705,248 B2 | 4/2010 | Lowffelholz et al. | |
| 7,990,726 B2 | 8/2011 | Izuhara et al. | |
| 8,630,094 B2 * | 1/2014 | Hsiao | H05K 7/1489 |
| | | | 361/726 |
| 9,095,045 B2 | 7/2015 | Rojo et al. | |
| 9,124,956 B2 | 9/2015 | Heimann et al. | |
| 9,307,659 B2 | 4/2016 | Lee et al. | |
| 9,313,935 B2 | 4/2016 | Soo Hoo et al. | |
| 9,857,851 B1 | 1/2018 | Van Pelt et al. | |
| 10,114,429 B1 * | 10/2018 | Shih | G11B 33/128 |
| 10,149,400 B2 | 12/2018 | Chen et al. | |
| 2008/0080158 A1 | 4/2008 | Crocker et al. | |
| 2008/0157638 A1 * | 7/2008 | Liu | G06F 1/187 |
| | | | 312/223.2 |
| 2009/0129905 A1 * | 5/2009 | McIntosh | G06F 1/183 |
| | | | 414/471 |
| 2012/0229987 A1 | 9/2012 | Peng et al. | |
| 2014/0042883 A1 | 2/2014 | Lin | |
| 2017/0147042 A1 | 5/2017 | Liu et al. | |
| 2017/0150621 A1 | 5/2017 | Breakstone et al. | |
| 2018/0110152 A1 | 4/2018 | Van Pelt et al. | |
| 2019/0116684 A1 * | 4/2019 | Gold | H05K 7/1489 |

OTHER PUBLICATIONS

Grace Period Disclosure: O'Brien, Jeremy W., "AFRL, IBM Unveil World's Largest Neuromorphic Digital Synaptic Super Computer", Air Force Research Laboratory Information Directorate, published Jul. 24, 2018, at: https://www.wpafb.af.mil/News/Article-Display/Article/1582310/afrl-ibm-unveil-worlds-largest-neuromorphic-digital-synaptic-super-computer/ (1 page).

* cited by examiner

SLIDABLE ASSEMBLY WITH SPRING CLIP RETAINER

STATEMENT REGARDING FEDERALLY SPONSORED RESEARCH OR DEVELOPMENT

This invention was made with Government support under Contract Number FA8750-17-C-0097, awarded by the United States Air Force (USAF). The Government has certain rights to this invention.

STATEMENT REGARDING PRIOR DISCLOSURES

The following disclosure is submitted under 35 U.S.C. § 102(b)(1)(A):

DISCLOSURE(S): "AFRL, IBM Unveil World's Largest Neuromorphic Digital Synaptic Super Computer", by Jeremy W. O'Brien, Air Force Research Laboratory Information Directorate, published Jul. 24, 2018, at: https://www.wpafb.af.mil/News/Article-Display/Article/1582310/afrl-ibm-unveil-worlds-largest-neuromorphic-digital-synaptic-super-computer/(1 page).

BACKGROUND

In many computer applications, including information technology (IT) applications, processors, along with their associated electronics (e.g., memory, disk drives, power supplies, etc.), are packaged in electronic component chassis or drawer configurations stacked within a computer rack or frame. An electronic component chassis, such as a server chassis, can be removable from the computer rack, or in a fixed location within the rack.

As circuit density of electronic devices continues to increase in order to achieve faster and faster processing speeds, there is corresponding demand for circuit devices to be packed more closely together. Each new generation of processors and associated electronics continues to offer increased speed and function. In many cases, this is accomplished, in part, by increased packaging density. The net result has been increased circuit density at all levels of packaging, including at the chassis or drawer level. This increased packaging density continues to require enhancements to chassis-level designs, and associated structures.

SUMMARY

Certain shortcomings of the prior art are overcome and additional advantages are provided through the provision, in one or more aspects, of an apparatus which includes a support, a slidable assembly, and a spring-clip element. The slidable assembly is slidably coupled to the support to slide along the support between a first position and a second position. The slidable assembly includes a slide member, and the spring-clip element is associated with the support, and receives the slide member of the slidable assembly. The slide member translates within the spring-clip element as the slidable assembly is slid between the first position and the second position, and is retained by the spring-clip element in position when the slidable assembly is slid to the second position to hold the slidable assembly and restrain the slidable assembly from sliding along the support to the first position.

In another aspect, an apparatus is provided which includes an electronic component chassis, an inclined support mounted to the electronic component chassis, a slidable assembly, and a spring-clip element. The slidable assembly is slidably coupled to the inclined support to slide along the inclined support between a lower position and an upper position. The slidable assembly includes a slide member, and the spring-clip element is associated with the inclined support, and receives the slide member of the slidable assembly. The slide member translates within the spring-clip element as the slidable assembly is slid between the lower position and the upper position, and is retained by the spring-clip element in position when the slidable assembly is slid to the upper position to hold the slidable assembly and retain the slidable assembly from sliding due to gravity down the inclined support to the lower position.

In a further aspect, a method is provided which includes providing an apparatus within an electronic component chassis. The providing includes mounting a support to the electronic component chassis, and slidably coupling a slidable assembly to the support to slide along the support between a first position and a second position. The slidable assembly includes a slide member, and providing the apparatus further includes providing a spring-clip element associated with the support to receive the slide member of the slidable assembly. The slide member translates within the spring-clip element as the slidable assembly is slid between the first position and the second position, and is retained by the spring-clip element in position when the slidable assembly is slid to the second position to hold the slidable assembly and restrain the slidable assembly from sliding along the support to the first position.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages and details thereof, are explained more fully below with reference to the non-limiting example(s) illustrated in the accompanying drawings. Descriptions of well-known systems, devices, fabrication techniques, etc., are omitted so as not to unnecessarily obscure the invention in detail. It should be understood, however, that the detailed description and the specific example(s), while indicating aspects of the invention, is given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of an apparatus, or slidable assembly, with a spring-clip element.

As noted, as circuit density of electronic devices continues to increase in order to achieve faster and faster processing speeds, there is a corresponding demand for devices to be packed more closely together, including within an electronic component chassis. In one or more implementations, an electronic component chassis, such as a drawer, is a frame or other internal support structure on or within which circuit board assemblies and/or other electronic devices are mounted. As one example, an electronic component chassis can be a server chassis, which can be removable from a computer rack, or in a fixed location within the rack. Traditionally, a computer rack is a metal frame structure used to hold various hardware devices, such as servers, hard disk drives, modems, and other electronic equipment. While racks are provided in many different shapes and sizes, a standard sized rack established by the Electronics Industries Association (EIA) for use with computers and other electronic equipment is typically 19-inches or 23-inches wide. In order to place additional componentry within an electronic component chassis of a standard-sized rack, it can be desirable to mount one or more electronic assemblies at an incline within the electronic component chassis.

Figure 1:
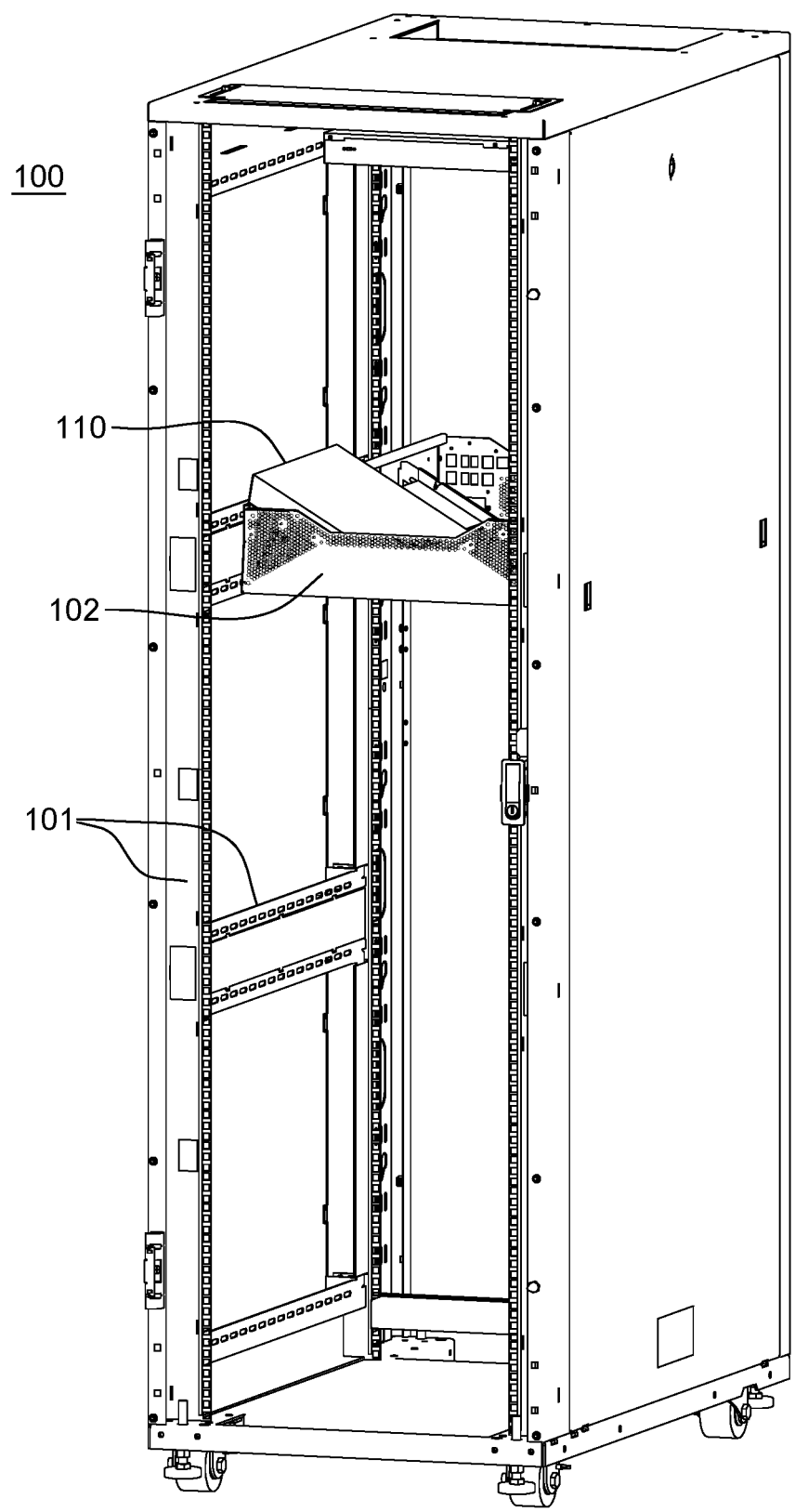
FIG. 1 depicts one embodiment of a computer rack or frame to accommodate one or more electronic component chassis or drawers with one or more inclined, slidable assemblies, in accordance with one or more aspects of the present invention.
Figure 2:
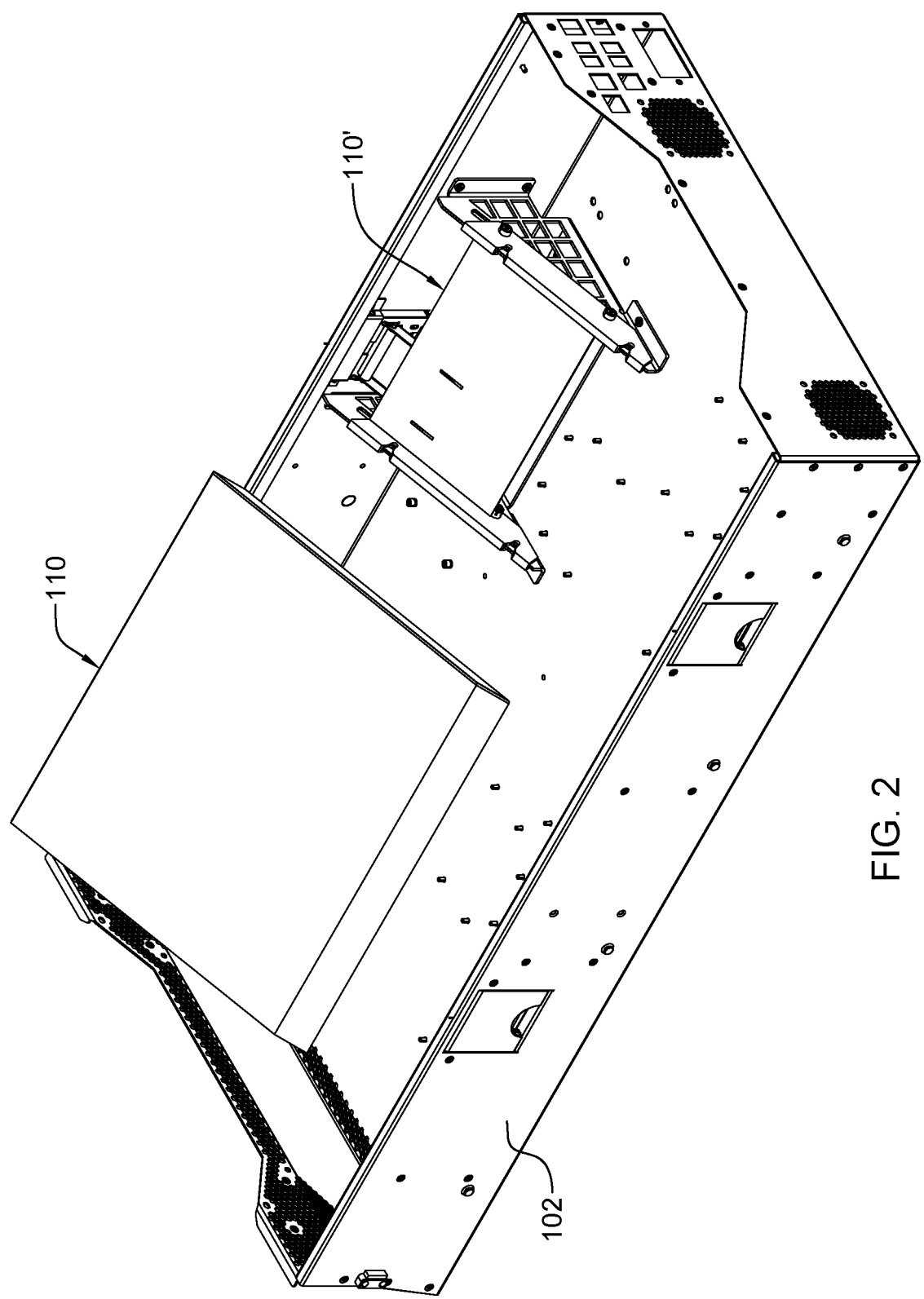
FIG. 2 depicts the electronic component chassis of FIG. 1, showing one embodiment of a slidable assembly, in accordance with one or more aspects of the present invention.

By way of example, FIG. 1 depicts one embodiment of a typical EIA standard computer rack 100, having multiple vertical and horizontal support rails 101. As illustrated, computer rack 100 can accommodate one or more electronic component chassis 102. At least one electronic component chassis 102 can accommodate, in one or more embodiments, one or more slidable assemblies 110. Note that, for purposes of illustration only, computer rack 100 is substantially unpopulated, with the exception of electronic component chassis 102 accommodating slidable assembly 110. FIG. 2 depicts the partially-populated electronic component chassis 102 embodiment of FIG. 1, with slidable assembly 110 shown in operative position, and with another slidable assembly 110' depicted without the respective electronic assembly thereof.

In one or more embodiments, a user-actuated, inclined assembly, such as slidable assembly 110 of FIGS. 1 & 2, includes a removable electronic assembly that translates along an inclined plane. In practice, the electronic assembly could be inserted into or extracted from the carrier mechanism by an operator manually sliding and holding with one hand the carrier mechanism in an upper position, and then inserting or removing the electronic assembly. This requires the operator to keep one hand on the carrier mechanism, preventing the operator from using both hands to insert or extract the electronic assembly from the carrier sled.

Advantageously, disclosed herein is a spring-clip element that engages a slide member of the slidable assembly to hold the slidable assembly in the fully undocked position to allow an operator to use both hands to lift the electronic assembly off the carrier mechanism or sled, and similarly, to allow the operator to place a new electronic assembly onto the carrier sled using two hands. Without the retaining feature, the assembly could slide along the support, potentially damaging the component connectors, as well as making more difficult the removal and/or insertion of the electronic assembly.

By way of example, the electronic assembly can be a circuit board assembly, such as a 5-10 pound printed circuit board assembly, that is operatively plugged or unplugged along an inclined plane defined by an inclined support. In one or more embodiments, the inclined, slidable assembly can include a lever arm and linkage to allow an operator to actuate with one hand the inclined, slidable assembly to slide the slidable assembly from a first (e.g., lower), docked position, to a second (e.g. upper), undocked position. By inclusion of a spring-clip element such as disclosed herein, the carrier sled is retained in place, allowing a relatively large, sensitive electronic assembly to be lifted by an operator with two hands, for instance, during removal from or insertion into the electronic component chassis. To ensure the electronic assembly connector is fully undocked from the chassis connector (e.g., server connector), and to ensure connector alignment during operative plugging, one or more slot openings into which alignment or retaining elements of the electronic assembly slide can feature only a small opening at the fully undocked, upper position, where the electronic assembly can be lifted off from or placed onto the carrier sled.

Generally stated, disclosed herein is an apparatus, or slidable assembly, which includes a support, a slidable assembly, and a spring-clip element. The slidable assembly slidably couples to the support to slide along the support between a first position and a second position, and the slidable assembly includes a slide member. The spring-clip element is associated with the support, and receives the slide member of the slidable assembly. The slide member translates within the spring-clip element as the slidable assembly is slid between the first position and the second position and is retained by the spring-clip element in position when the slidable assembly is slid to the second position to hold the slidable assembly and restrain the slidable assembly from sliding along the support to the first position.

In one or more embodiments, the spring-clip element includes a neck region through which the slide member passes as the slidable assembly is slid from the first position to the second position. For instance, in one implementation, the neck region flexes to allow passage of the slide member as the slidable assembly is slid from the first position to the second position, and relaxes, at least in part, as the slide member passes with the slidable assembly reaching the second position to hold the slide member in position, thereby retaining the slidable assembly in the second position.

In one or more embodiments, the support includes multiple slots which receive multiple coupling members coupling the slidable assembly to the support. In one or more embodiments, the slide member is one coupling member of the multiple coupling members.

In one or more implementations, the spring-clip element is a spring-clip bushing residing within a slot in the support.

In one or more embodiments, the slidable assembly includes a carrier sled, with an electronic assembly being coupled to the carrier sled. In one embodiment, the electronic assembly is in a docked, operational position when the slidable assembly is in the first position, and is an undocked, non-operational position when the slidable assembly is in the second position, where the electronic assembly is removable from the carrier sled.

In one implementation, the carrier sled includes a sidewall structure with a downward-facing channel that receives, at least in part, a frame edge of the support.

In one or more embodiments, the spring-clip element resides within the support, and the sidewall structure of the carrier sled overlies, at least in part, the spring-clip element. For instance, the spring-clip element coupled to the support can reside fully within the downward-facing channel of the sidewall structure of the carrier sled.

In one or more implementations, the support includes multiple inclined frame members, with the slidable assembly being slidably coupled to the multiple inclined frame members to slide along the multiple inclined frame members between the first position and the second position. In one embodiment, the spring-clip element is associated with one inclined frame member of the multiple inclined frame members.

In one or more embodiments, the support is an inclined support, the first position is a lower position, and the second position is an upper position, where the spring-clip element retains the slidable assembly in the upper position, restraining the slidable assembly from sliding due to gravity down the inclined support to the lower position.

In one or more implementations, the carrier sled, spring-clip element, and support are each electrically conductive to facilitate grounding the electronic assembly coupled to the carrier sled.

By way of illustration, FIGS. 3A-6C depict a detailed embodiment of the apparatus or slidable assembly 110 of FIGS. 1 & 2. As noted, variations on the embodiment depicted will be apparent to those skilled in the art based on the description provided herein. Note also that slidable assembly 110 is described below as an inclined, slidable assembly in connection with FIGS. 3A-3C, which is one example of a slidable assembly. In one or more other implementations, the slidable assembly could be oriented at a different angle than that depicted, or at no angle, being substantially horizontal, such as may be the advantageous with an electronic assembly to be disposed in docked position below one or more other features of an electronic component chassis.

Figure 3A:
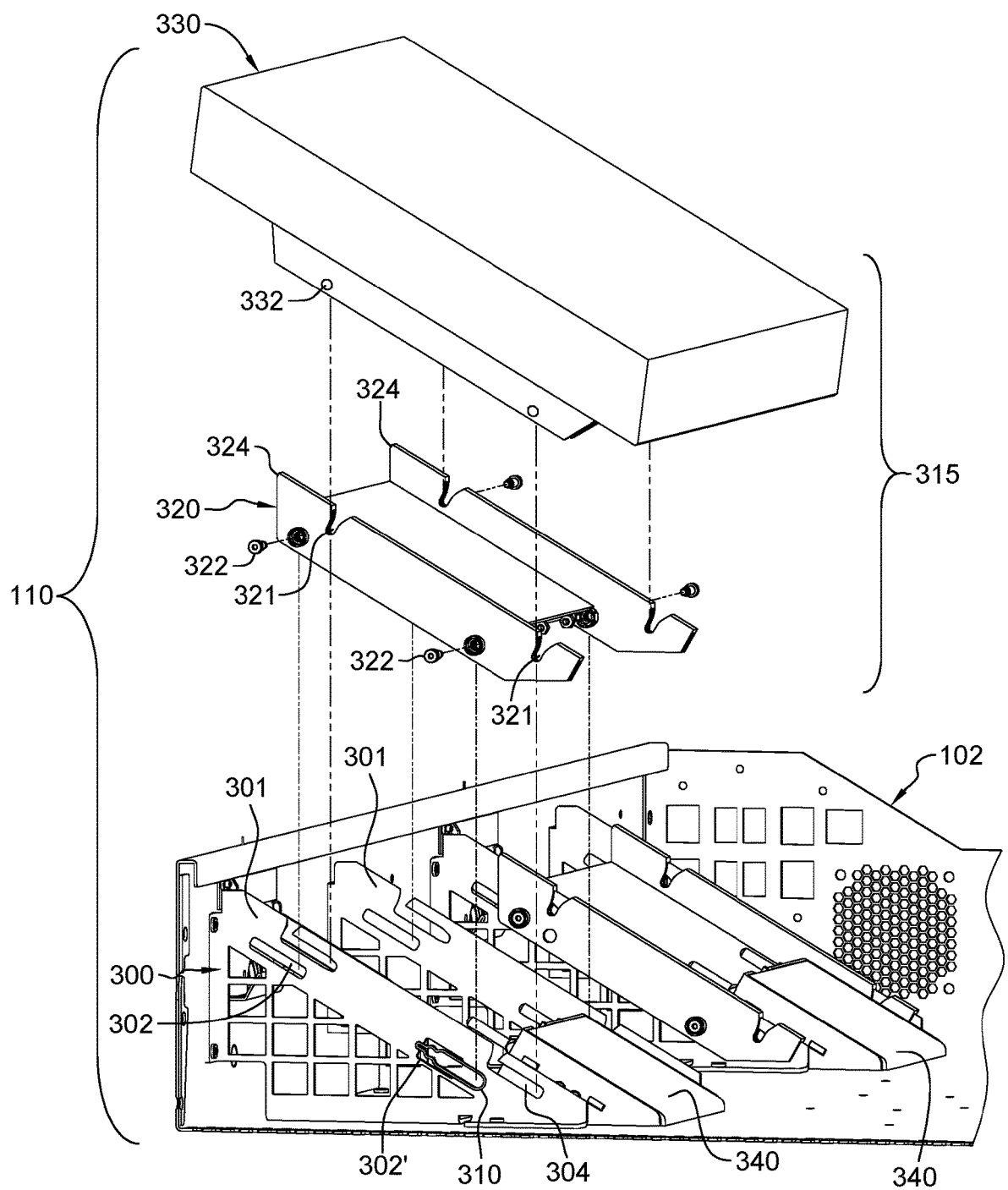
FIG. 3A is a partially exploded view of one embodiment of the slidable assembly of FIG. 2, in accordance with one or more aspects of the present invention.

Referring initially to FIG. 3A, a partially exploded view of one embodiment of slidable assembly 110 is illustrated, wherein an inclined support 300 is provided to which a slidable assembly 315 is slidably coupled to slide along the inclined support 300 between a lower position and an upper position. In the embodiment illustrated, the slidable assembly 315 includes a carrier sled 320, or slidable platform, and an electronic assembly 330, such as a circuit board assembly that is operatively positioned within electronic component chassis 102 at an angle, for instance, by operatively docking an electronic assembly connector (see FIG. 3C) with a chassis system connector 340.

Figure 3B:
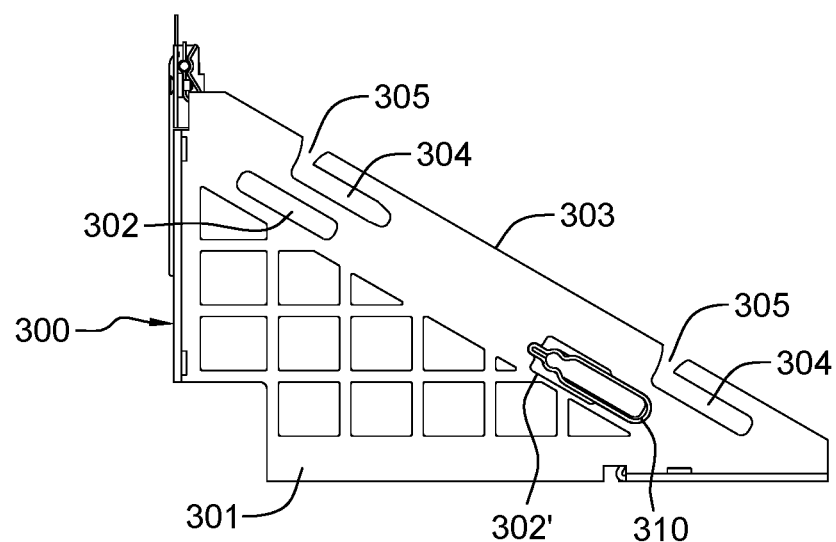
FIG. 3B is a side elevational view of the inclined support and spring-clip element of FIG. 3A, in accordance with one or more aspects of the present invention.

Referring to FIGS. 3A & 3B, inclined support 300 is formed as a rigid support structure which couples or fastens (in one embodiment) to a base and sidewall of electronic component chassis 102. In the embodiment illustrated, inclined support 300 is a single-piece support structure having two similar inclined frame members 301, sized and spaced to accommodate slidable assembly 315. Those skilled in the art will note that in other embodiments, a single inclined frame member could be utilized, or more than two inclined frame members could be used. In the embodiment illustrated, inclined frame members 301 are located at opposite sides of slidable assembly 315. Each inclined frame member 301 includes an inclined frame edge 303 at a desired incline for the inclined, slidable assembly. The inclined frame members 301 are similar and include (in one or more embodiments) a first set of slots 302 and a second set of slots 304. First set of slots 302 receive slide members 322 (see FIG. 3A) of slidable assembly 315, and in particular, of carrier sled 320. In one embodiment, slide members are coupling members that slidably couple carrier sled 320 to inclined support 300. In the embodiment illustrated, second set of slots 304 have openings 305 to allow respective retaining members 332 of electronic assembly 330 to, along with openings 321 in carrier sled 320, simultaneously couple electronic assembly 330 to carrier sled 320, and slidably couple electronic assembly 330 to inclined frame members 301 of inclined support 300.

As illustrated in FIGS. 3A & 3B, spring-clip element 310 is associated with one of the inclined frame members 301. For instance, in the embodiment illustrated, spring-clip element 310 is a flexible spring-clip bushing residing within an enlarged slot 302' of the first set of slots in inclined frame member 301. As illustrated, in one embodiment, enlarged slot 302' of inclined frame member 301 is differently configured from slot 302 to allow flexing of spring-clip element 310 as described herein. In one or more other embodiments, slot 302 can be similarly configured to slot 302', and both slots 302, 302' could have a respective spring-clip bushing residing therein. Further, in one or more embodiments, each inclined frame member 301 could have a spring-clip element 310 associated therewith, such as a spring-clip bushing positioned within an appropriately configured slot.

Advantageously, where spring-clip element 310 is a spring-clip bushing, as illustrated in FIGS. 3A & 3B, spring-clip element 310 can be formed of a flexible polymer material. For instance, in one embodiment, spring-clip element 310 is an engineered plastic, such as a polycarbonate spring-clip bushing, which advantageously is low cost and easy to fabricate, and provides a low-friction coefficient, and allows interchangeability of different spring-clip elements for accommodating various slidable assembly weights, and various desired tactile feedbacks to the operator. Further, by configuring spring-clip element as a spring-clip bushing, the spring-clip bushing can inhibit noise or rattling between, for instance, metal slide members 322 and inclined frame members 301, for instance, where the inclined frame member is formed of metal, such as a sheet metal. Further, note that in one or more embodiments, the thickness of the spring-clip bushing can be tailored to the thickness of the inclined frame member 301. For instance, in one or more embodiments, the thickness of spring-clip element 310 can be the same or less than the thickness of the respective inclined frame member 301. As one specific example, the inclined frame member can be formed from 1-3 mm sheet metal, with the spring-clip element having a corresponding thickness.

Figure 3C:
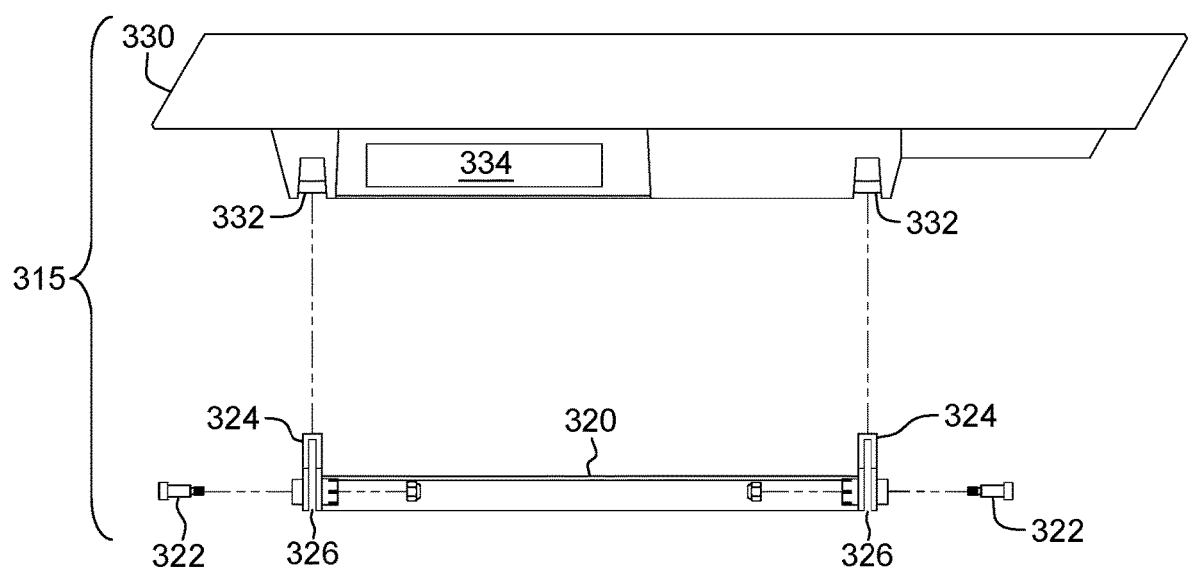
FIG. 3C is a partially exploded, elevational view of the carrier sled and electronic assembly of the slidable assembly of FIG. 3A, in accordance with one or more aspects of the present invention.

FIGS. 3A & 3C depict one embodiment of slidable assembly 315. As noted, slidable assembly 315 includes (by way of example) a carrier sled 320, and an electronic assembly 330. As illustrated, retaining members 332 of electronic assembly 330 reside within appropriately shaped openings 321 in opposite sidewall structures 324 of carrier sled 320. As illustrated in FIG. 3C, sidewall structures 324 each include a downward-facing channel 326 sized and configured to receive the inclined frame edge of the respective inclined frame member (see FIG. 3A). Slide members 322 can be appropriately sized and configured fasteners that facilitate slidably coupling carrier sled 320 to the respective inclined frame member 301, by passing the slide members through the first set of slots 302, 302' in the inclined frame member 301, as shown in FIG. 3A.

By way of example, FIG. 3C also illustrates one embodiment of electronic assembly connectors 334, which are configured as needed for the particular electronic assembly 330 to operatively insert or dock to the respective chassis system connector 340 (FIG. 3A) within electronic component chassis 102.

Figure 4A:
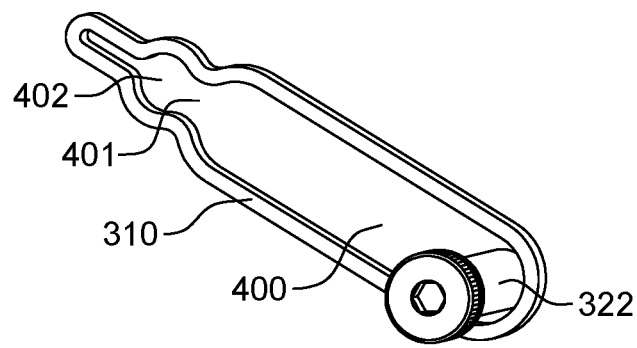
FIG. 4A is an enlarged depiction of the spring-clip element embodiment of FIGS. 3A & 3B, showing a slide member of the slidable assembly of FIG. 3A in a first position within the spring-clip element, in accordance with one or more aspects of the present invention.
Figure 4B:
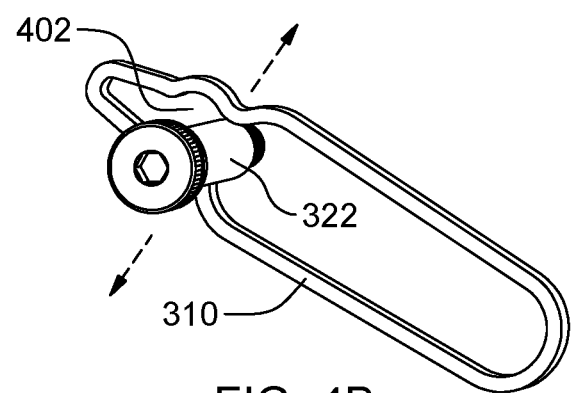
FIG. 4B depicts the spring-clip element and slide member of FIG. 4A, with the slide member translated to a neck region of the spring-clip element, during sliding of the slidable assembly of FIG. 3A from the first position towards the second position, and illustrating flexing of the spring-clip element to allow passage of the slide member, in accordance with one or more aspects of the present invention.
Figure 4C:
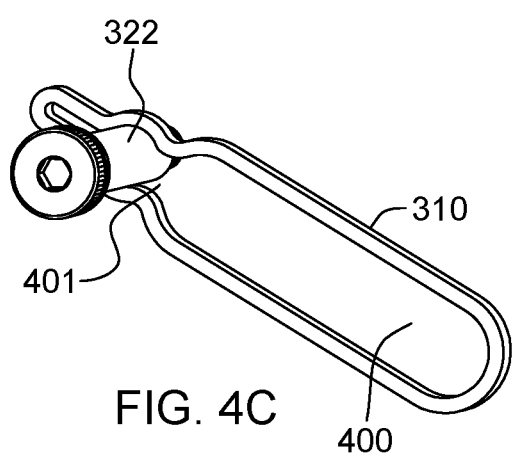
FIG. 4C depicts the spring-clip element and slide member of FIGS. 4A & 4B, with the slide member shown disposed within a retaining region of the spring-clip element corresponding to the slidable assembly of FIG. 3A being in the second position, in accordance with one or more aspects of the present invention.

FIGS. 4A-4C depict in greater detail operation of spring-clip element 310 of the inclined, slidable assembly 110 of FIGS. 3A-3C.

In FIG. 4A, a slide member 322 of the slidable assembly is shown in a lower position corresponding to a lower-most position of the slidable assembly of FIGS. 3A-3C. In the embodiment illustrated, spring-clip element 310 is a spring-clip bushing, as in the example above. The spring-clip bushing is configured with an opening 400 that receives slide member 322. In one embodiment, opening 400 includes a main portion within which slide member 322 translates, as well as a neck region 401, and a retaining region 402 at one end. As noted, in one or more embodiments, spring-clip element 310 is fabricated of a flexible material, and as slide member 322 moves upward with sliding movement of the slidable assembly from the lower position towards the upper position, the slide member passes through neck region 401, which flexes, as illustrated in FIG. 4B, to allow passage of the slide member. Note in this regard that the slidable assembly can be slid relative to the inclined support manually by an operator pushing the slidable assembly or, in one or more embodiments, by actuating a lever and linkage (discussed below) to move the slidable assembly relative to the inclined support, and thus, to move slide member 322 within spring-clip element 310.

Once past neck region 401, slide member 322 is engaged or held within retaining region 402 of spring-clip element 310. In this location, neck region 401 of spring-clip element 310 relaxes, at least in part, with the retaining region of spring-clip element being sized and configured to retain and hold slide member 322. In one embodiment, the retaining by retaining region 402 of slide member 322 is sufficient to hold the slidable assembly in the upper position, and restrain the slidable assembly from sliding to due gravity down the inclined support to the lower position, thereby freeing the operator to use both hands when removing the electronic assembly.

As noted, in one or more implementations, multiple spring-clip elements could be used in association with the inclined support, such as the inclined frame members of FIGS. 3A & 3B. For instance, each slot of the first set of slots could be configured to receive and accommodate a respective spring-clip element, such as spring-clip element 310. In one or more other embodiments, each inclined frame member 301 (FIG. 3A) could have an associated spring-clip element in an appropriately configured slot.

Note further that other configurations of spring-clip element 310 are possible. For instance, the neck region, as well as the retaining region, can be varied as desired to achieve different holding forces and different tactile feedbacks to the operator depending on the implementation. In one or more embodiments, the retaining region has a diameter equal to or smaller than the diameter of the slide member in order to grip the slide member with a desired force to hold the slidable assembly in the upper position. Further, note that the spring-clip element could include multiple neck regions and multiple retaining regions. For instance, a middle retaining region could be defined between two neck regions, or a lower retaining region could be defined at the lower end of the spring-clip element, for instance, to facilitate holding the slidable assembly in a docked, operative position, if desired. Further, those skilled in the art should note that the position of the spring-clip element can vary depending on the implementation. For instance, in one or more other implementations, the spring-clip element could be retained on either side of the respective inclined frame member, with an appropriate modification to the carrier sled's sidewall structure.

Figure 5:
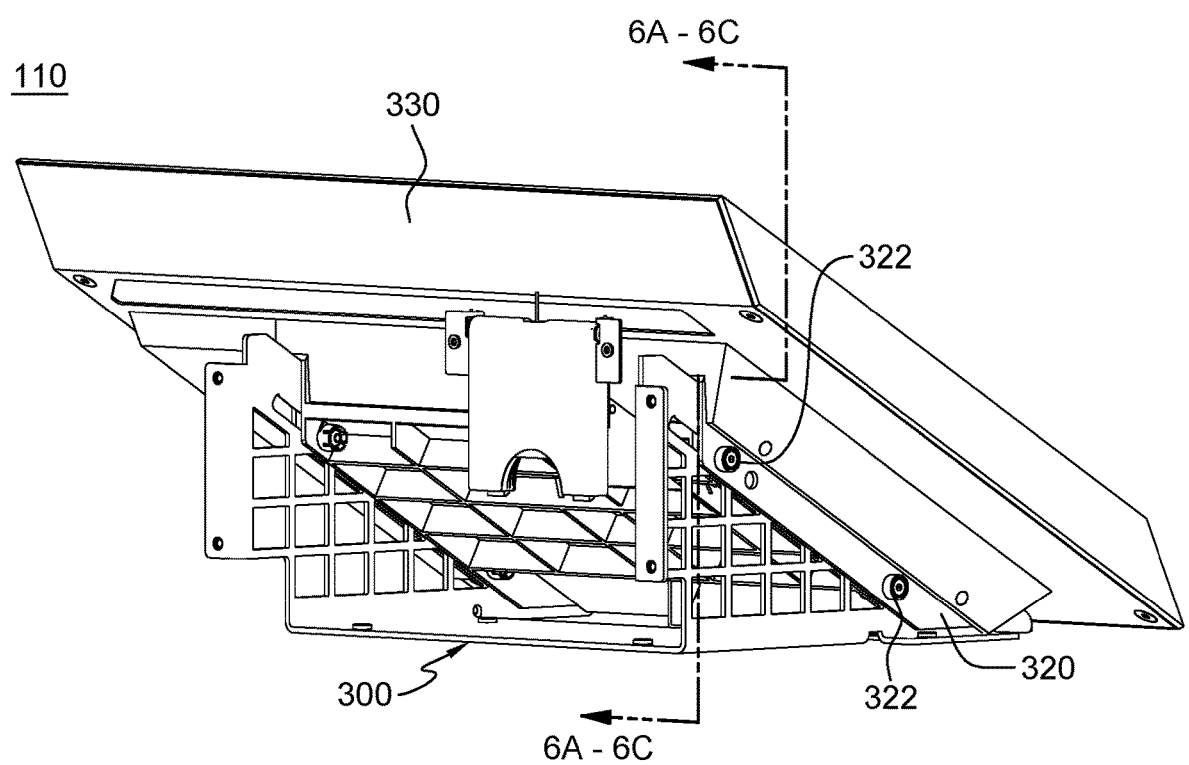
FIG. 5 depicts an assembled view of the slidable assembly of FIGS. 2-4C, in accordance with one or more aspects of the present invention.

FIG. 5 is a rear view of the slidable assembly 110 of FIGS. 2-4C. As noted, the slidable assembly includes, in one embodiment, a carrier sled 320 and electronic assembly 330 which resides on carrier sled 320. The slidable assembly is slidably coupled via one or more slide members 322 which pass through respective slots in the inclined frame members. As explained, at least one spring-clip element is associated with at least one inclined frame member. In one implementation, the spring-clip element can be a spring-clip bushing disposed within an appropriately configured slot in one of the inclined frame members through which the slide members 322 are inserted. Further, note that in one embodiment of inclined support 300, the inclined frame members are part of a single piece or single element support structure to be secured to the electronic component chassis.

Figure 6A:
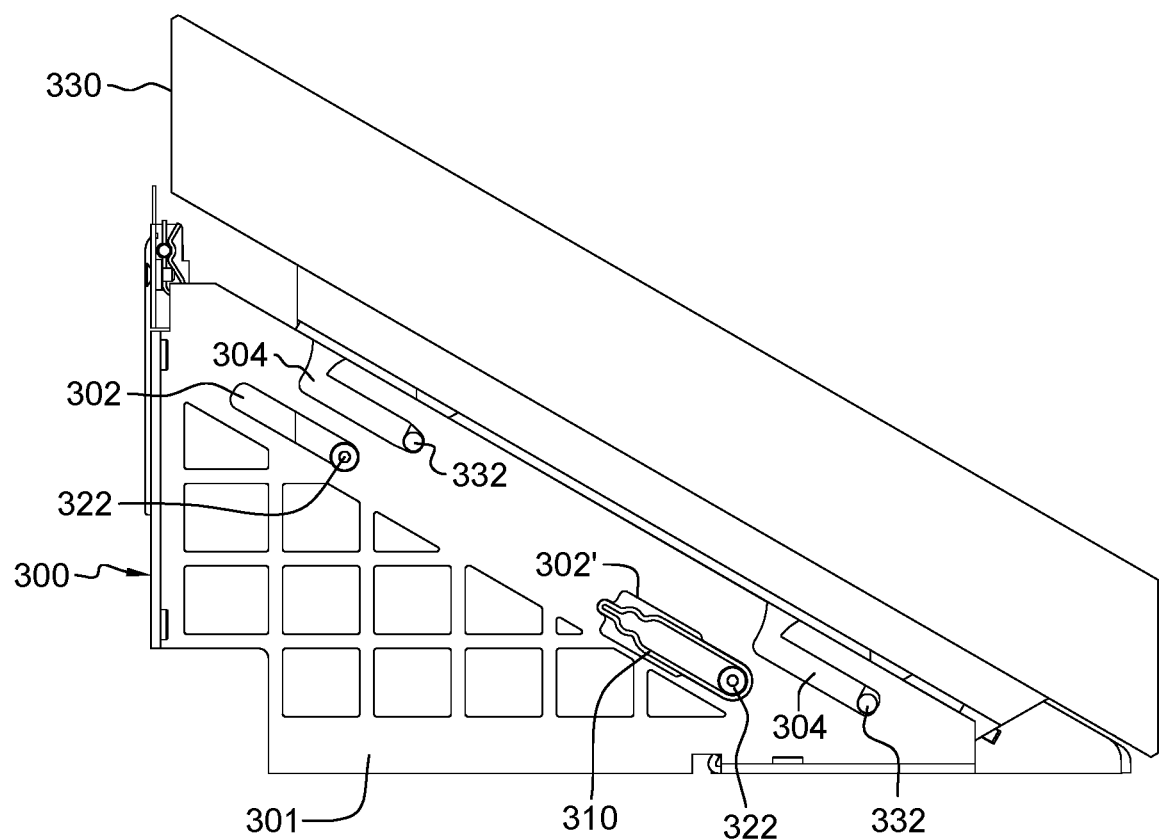
FIG. 6A is a cross-sectional elevational view of the slidable assembly of FIG. 5, taken along line 6A-6C thereof, and showing the slidable assembly operatively docked in the first position, in accordance with one or more aspects of the present invention.
Figure 6B:
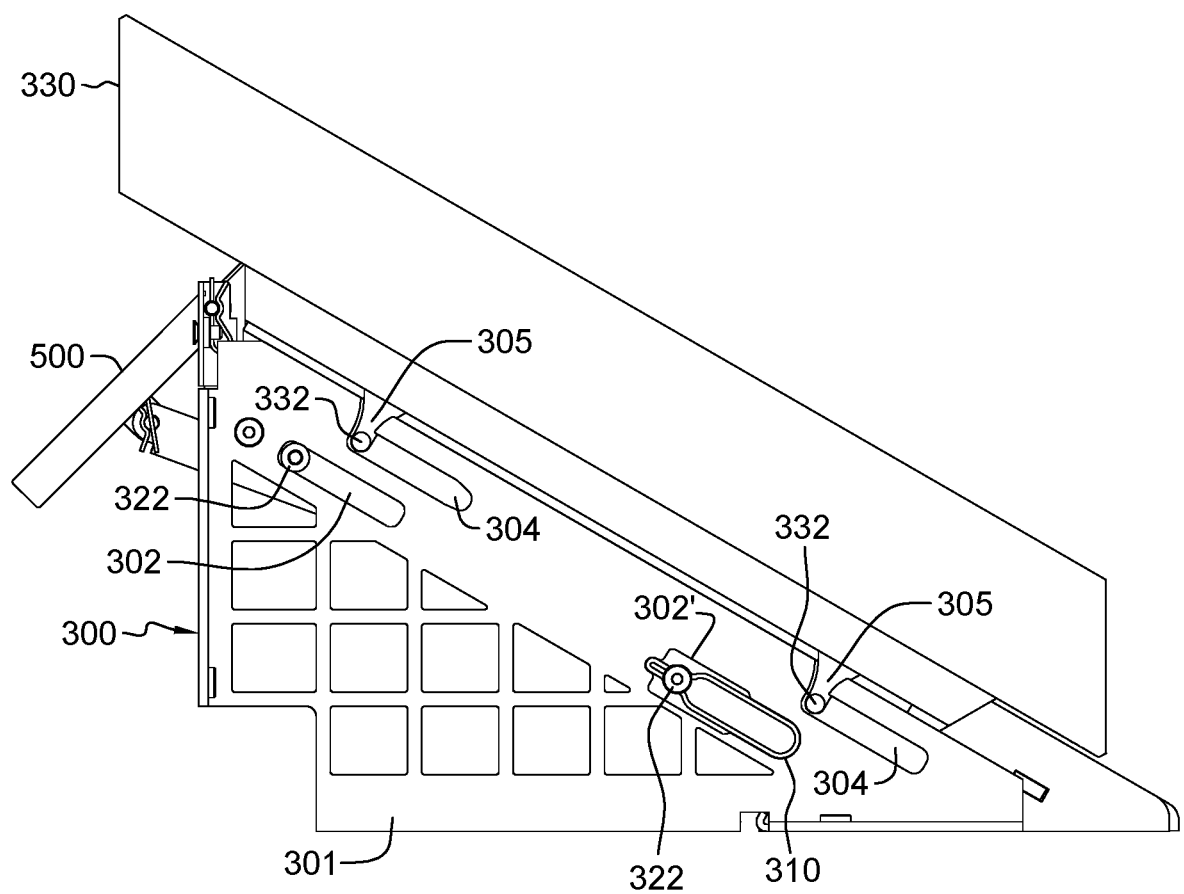
FIG. 6B depicts the slidable assembly of FIG. 6A, with the slidable assembly shown undocked and in a second position, with the slide member of the slidable assembly being retained by the spring-clip element, in accordance with one or more aspects of the present invention.
Figure 6C:
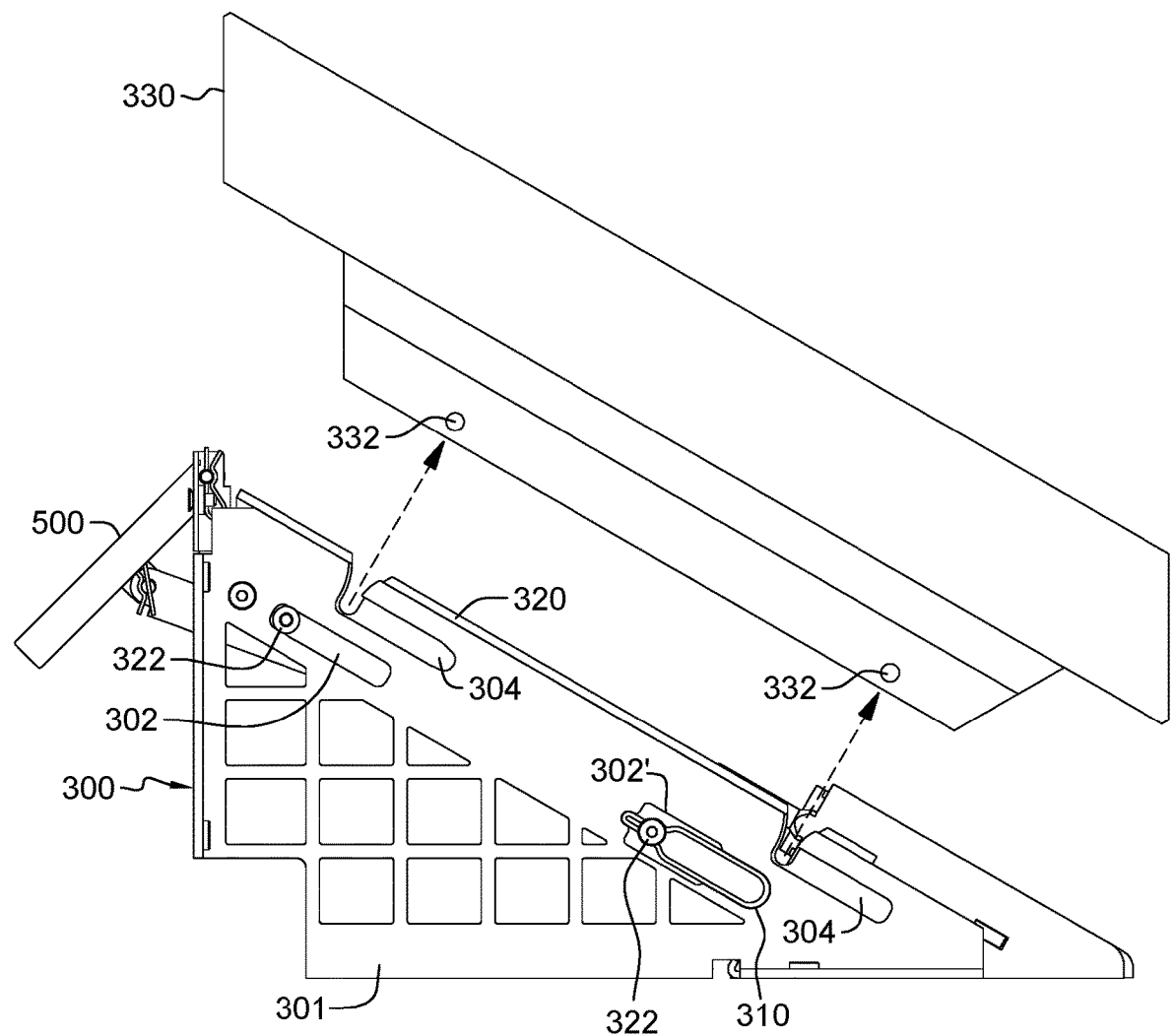
FIG. 6C depicts the slidable assembly embodiment of FIG. 6B, with the electronic assembly shown being lifted off from the carrier sled, in accordance with one or more aspects of the present invention.

FIGS. 6A-6C are cross-sectional elevational views of the inclined, slidable assembly of FIG. 5, taken along line 6A-6C thereof. These figures illustrate operation of the inclined, slidable assembly, including operation of spring-clip element 310.

In FIG. 6A, electronic assembly 330 is shown in a lower position, which in one embodiment, is a docked, operational position for the electronic assembly within the electronic component chassis, as explained herein. In this position, slide members 322 are also in a lower position within the respective slots 302, 302' in inclined support frame(s) 300. Similarly, retaining members 332 associated with electronic assembly 330 are in a lower position within slots 304 in inclined support frame 301.

In FIG. 6B, an operator has translated the slidable assembly to an upper position by, in one embodiment, actuating lever arm and linkage 500, which couples to the carrier sled to slide the sled upward, moving electronic assembly 300 to an undocked, non-operational, upper position. In this position, slide member 322 within slot 302' in inclined frame member 301 has moved past the neck region of spring-clip element 310 into the retaining region, where the slide member is held in place, thus restraining the slidable assembly from sliding due to gravity down the inclined frame member. In this position, retaining members 332 within slots 304 align with openings 305, which allows an operator to lift electronic assembly 330 from carrier sled 320 with both hands (see FIG. 6C).

Advantageously, the inclined, slidable assembly disclosed herein does not require transverse-applied force or even operator access to sliding components to overcome the upper, latched condition. For instance, in one or more embodiments, the retention force by which the spring-clip element holds the slide member in the retaining region can be overcome by pressing down on lever arm 500, for instance, after the electronic assembly has been placed onto the carrier sled with alignment pins 332 within the second set of slots 304. Further, an operator can advantageously move the slidable assembly between the upper position and lower position by actuating with one hand lever arm and linkage 500. In one embodiment, the lever arm can be exposed through a sidewall of the electronic component chassis to allow an operator to readily dock and undock the electronic assembly with the chassis system connector.

Note further that, in one or more implementations, the spring-clip element advantageously holds the slidable assembly, and in particular, the electronic assembly, in the non-operational, upper position, and can be configured based on the weight of the particular slidable assembly with which it is used. Further, the retaining force provided by the spring-clip element can be tailored or configured as desired, for instance, by changing the geometry of the neck region, or the flexibility of the spring-clip element material, as desired. The unique shape of the spring-clip element allows the user to finely tune the catch-and-release force precisely for a particular pluggable electronic assembly. The approach allows for multiple different spring-clip elements to be readily fabricated to accommodate pluggable assemblies of widely varying weights. This can be achieved by varying the material, as well as the thickness and configuration of the spring-clip element, such as discussed herein.

Further, in one or more implementations, the spring-clip element can be integrated as a spring-clip bushing into the geometry of the inclined support, as disclosed. In one embodiment, the spring-clip bushing can be a polycarbonate spring-clip bushing, which advantageously is low cost, easy to fabricate, and provides a low friction coefficient, and can be used in different configurations interchangeably for various assembly weights and tactile feedback.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
   an electronic component drawer to reside within a computer rack frame, the electronic component drawer comprising a drawer base and a drawer sidewall extending from the drawer base;
   an inclined support fastened to the drawer base of the electronic component drawer and including an inclined edge, the inclined edge extending upwards towards the drawer sidewall, between the drawer base and the drawer sidewall, with the drawer base, drawer sidewall extending from the drawer base, and inclined edge extending upwards towards the drawer sidewall, together defining a triangular-shaped arrangement of the electronic component drawer;
   a slidable assembly slidably coupled to the inclined support to slide along the inclined edge of the inclined support between a first, lower position and a second, upper position, the slidable assembly including a slide member with an electronic assembly coupled thereto; and
   a spring-clip element associated with the inclined support, and receiving the slide member of the slidable assembly, wherein the slide member translates within the spring-clip element as the slidable assembly is slid between the first, lower position and the second, upper position, and is retained by the spring-clip element in position when the slidable assembly is slid to the second, upper position to hold the slidable assembly and restrain the slidable assembly from sliding along the inclined support to the first, lower position.

2. The apparatus of claim 1, wherein the spring-clip element includes a neck region through which the slide member passes as the slidable assembly is slid from the first position to the second position.

3. The apparatus of claim 2, wherein the neck region flexes to allow passage of the slide member as the slidable assembly is slid from the first position to the second position, and relaxes, at least in part, as the slide member passes with the slidable assembly reaching the second position to hold the slide member in position, and thereby retain the slidable assembly in the second position.

4. The apparatus of claim 2, wherein the inclined support includes multiple slots which receive multiple coupling members coupling the slidable assembly to the inclined support, the slide member being one coupling member of the multiple coupling members.

5. The apparatus of claim 1, wherein the spring-clip element is a spring-clip bushing residing within a slot in the support.

6. The apparatus of claim 1, wherein the slidable assembly includes a carrier sled with the electronic assembly coupled to the carrier sled, and wherein the electronic assembly is in a docked, operational position when the slidable assembly is in the first position and is in an undocked, non-operational position when the slidable assembly is in the second position, where the electronic assembly is removable from the carrier sled.

7. The apparatus of claim 6, wherein the carrier sled includes a sidewall structure with a downward-facing channel that receives, at least in part, the inclined edge of the inclined support.

8. The apparatus of claim 7, wherein the spring-clip element resides within the inclined support, and the sidewall structure of the carrier sled overlies, at least in part, the spring-clip element.

9. The apparatus of claim 8, wherein the spring-clip element within the support resides within the downward-facing channel of the sidewall structure of the carrier sled.

10. The apparatus of claim 1, wherein the inclined support comprises multiple inclined frame members, the slidable assembly being slidably coupled to the multiple inclined frame members to slide along the multiple inclined frame members between the first position and the second position, and wherein the spring-clip element is associated with one inclined frame member of the multiple inclined frame members.

11. The apparatus of claim 1, wherein the spring-clip element retains the slidable assembly in the second, upper position, restraining the slidable assembly from sliding due to gravity down the inclined support to the first, lower position.

12. An apparatus comprising:
a computer rack frame;
an electronic component drawer mounted to the computer rack frame to reside within the computer rack frame, the electronic component drawer comprising a drawer base and a drawer sidewall extending from the drawer base;
an inclined support fastened to the drawer base of the electronic component drawer and including an inclined edge, the inclined edge extending upwards towards the drawer sidewall, between the drawer base and the drawer sidewall, with the drawer base, drawer sidewall extending from the drawer base, and inclined edge extending upwards towards the drawer sidewall, together defining a triangular-shaped arrangement of the electronic component drawer;
a slidable assembly slidably coupled to the inclined support to slide along the inclined edge of the inclined support between a first, lower position and a second, upper position, the slidable assembly including a slide member with an electronic assembly coupled thereto; and
a spring-clip element associated with the inclined support, and receiving the slide member of the slidable assembly, wherein the slide member translates within the spring-clip element as the slidable assembly is slid between the first, lower position and the second, upper position, and is retained by the spring-clip element in position when the slidable assembly is slid to the second, upper position to hold the slidable assembly and restrain the slidable assembly from sliding due to gravity down the inclined support to the first, lower position.

13. The apparatus of claim 12, wherein the spring-clip element includes a neck region through which the slide member passes as the slidable assembly is slid from the lower position to the upper position, and wherein the neck region flexes to allow passage of the slide member as the slidable assembly is slid from the lower position to the upper position, and relaxes, at least in part, as the slide member passes with the slidable assembly reaching the upper position to hold the slide member in position, and thereby retain the slidable assembly in the upper position.

14. The apparatus of claim 13, wherein the inclined support includes multiple slots which receive coupling members coupling the slidable assembly to the inclined support, the slide member being one coupling member of the multiple coupling members.

15. The apparatus of claim 12, wherein the spring-clip element is a spring-clip bushing residing within a slot in the inclined support.

16. The apparatus of claim 12, wherein the slidable assembly includes a carrier sled, with the electronic assembly coupled to the carrier sled, and wherein the electronic assembly is in a docked, operational position when the slidable assembly is in the lower position and is in an undocked, non-operational position when the slidable assembly is in the upper position, where the electronic assembly is removable from the carrier sled.

17. The apparatus of claim 16, wherein the carrier sled, spring-clip element, and support are electrically conductive to facilitate grounding the electronic assembly coupled to the carrier sled.

18. The apparatus of claim 16, wherein the carrier sled includes a sidewall structure with a downward-facing channel that receives, at least in part, an inclined frame edge of the inclined support.

19. The apparatus of claim 18, wherein the spring-clip element resides within the inclined support, and the sidewall structure of the carrier sled overlies, at least in part, the spring-clip element.

20. A method comprising:
providing an apparatus within an electronic component drawer, the providing comprising:
providing an electronic component drawer to reside within a computer rack frame, the electronic component drawer comprising a drawer base and a drawer sidewall extending from the drawer base;
fastening an inclined support to the drawer base of the electronic component drawer, the inclined support including an inclined edge, the inclined edge extending upwards towards the drawer sidewall, between the drawer base and the drawer sidewall, with the drawer base, drawer sidewall extending from the drawer base, and inclined edge extending upwards towards the drawer sidewall, together defining a triangular-shaped arrangement of the electronic component drawer;

slidably coupling a slidable assembly to the inclined support to slide along the inclined edge of the inclined support between a first, lower position and a second, upper position, the slidable assembly including a slide member with an electronic assembly coupled thereto; and providing a spring-clip element associated with the inclined support to receive the slide member of the slidable assembly, wherein the slide member translates within the spring-clip element as the slidable assembly is slid between the first, lower position and the second, upper position, and is retained by the spring-clip element in position when the slidable assembly is slid to the second, upper position to hold the slidable assembly and restrain the slidable assembly from sliding along the inclined support to the first, lower position.

* * * * *